United States Patent

Pisarevsky et al.

[11] Patent Number: 5,821,673
[45] Date of Patent: Oct. 13, 1998

[54] WAFER AND SURFACE ACOUSTIC WAVE DEVICE

[75] Inventors: Jury Vladimirovich Pisarevsky; Vladimir Nikolaevich Fedorets; Vladimir Aleksandrovich Pankov, all of Moscow, Russian Federation

[73] Assignees: Santech Company LImited, Yokahama, Japan; Bunch Limited, Moscow, Russian Federation

[21] Appl. No.: 862,393

[22] Filed: May 23, 1997

[30] Foreign Application Priority Data

May 29, 1996 [RU] Russian Federation ............ 96110002
Jan. 28, 1997 [JP] Japan .................................. 9-028547

[51] Int. Cl.⁶ .................................................. H01L 41/04
[52] U.S. Cl. ........................................ 310/360; 310/313 A
[58] Field of Search ................................. 310/360, 313 A

[56] References Cited

U.S. PATENT DOCUMENTS 5,557,968 9/1996 Krempl et al. .............................. 73/497

*Primary Examiner*—Mark O. Budd
*Assistant Examiner*—Timothy A. Williams
*Attorney, Agent, or Firm*—Hazel & Thomas

[57] ABSTRACT

A surface acoustic wave device capable of exhibiting high temperature stability and being downsized. The device includes a wafer constructed of a trigonal lanthanum/gallium silicate crystal cut out at predetermined cut angles ($\alpha$, $\beta$). Application of a predetermined voltage signal to the wafer permits a surface acoustic wave to be excited in the wafer and propagate in the wafer. Supposing that the crystal has three crystal axes including an X-axis (electric axis), a Y-axis (mechanical axis) and a Z-axis (optical axis), the wafer is cut out so that a normal line (n) on a surface of the wafer has the cut angle $\alpha$ defined to be $20° \leq \alpha \leq 40°$ with respect to the Y-axis in a counterclockwise direction from the Y-axis in a Y-Z plane and a propagation direction (S) of the surface acoustic wave has the cut angle $\beta$ defined to be $35° \leq \beta \leq 70°$ with respect to the X-axis in a counterclockwise direction from the X-axis in the surface of the wafer.

7 Claims, 8 Drawing Sheets

WAFER AND SURFACE ACOUSTIC WAVE DEVICE

BACKGROUND OF THE INVENTION

This invention relates to a wafer and a surface acoustic wave (SAW) device, and more particularly to a wafer and a surface acoustic wave device suitable for use for selecting a specific or desired frequency of a band pass filter, an oscillator, a delay line, a superimposing device or the like in a field of electronics and communication engineering such as radio electronics, acoustic electronics or the like associated with a communication equipment, a portable telephone or the like.

Conventionally, in a field of electronics and communication, a device using a crystal element made of ST-cut quartz crystal, a lithium niobate crystal, a lithium tantalate crystal or the like is proposed for selecting a specific or desired frequency. The crystal element made of ST-cut quartz crystal permits a surface acoustic wave to be excited in an X-axis direction thereof or a direction of an angle within a range between −20° and +36° with respect to the X-axis. The device using the crystal element made of ST-cut quartz crystal exhibits temperature stability as high as about 1 ppm/°C.

Unfortunately, the crystal element has relatively low electromechanical coupling coefficient, to thereby fail to provide a device of an intermediate frequency band. Also, it has another disadvantage of causing a surface acoustic wave to be relatively increased in propagation velocity, resulting in a size of the device being relatively increased, leading to an increase in consumption of the crystal material.

The device using the crystal element constructed of a lithium tantalate or lithium niobate crystal is commonly used for various kinds of radio electronic equipments requiring a wide band-pass zone although it is not particularly concerned with temperature characteristics.

However, the device using the crystal element constructed of a lithium tantalate or lithium niobate crystal is deteriorated in temperature stability to a level of 40 ppm/°C. or more, to thereby fail to be used as a device of a narrow frequency band and that of an intermediate frequency band. Also, it is relatively increased in propagation velocity of a surface acoustic wave, to thereby cause a size of the device to be relatively increased, resulting in consumption of the crystal material being relatively increased.

SUMMARY OF THE INVENTION

The present invention has been made in view of the foregoing disadvantage of the prior art.

Accordingly, it is an object of the present invention to provide a novel wafer which is capable of being effectively used for selecting a specific or desired frequency of a band pass filter, an oscillator, a delay line, a superimposing device or the like in a field of electronics and communication engineering such as radio electronics, acoustic electronics or the like associated with a communication equipment, a portable telephone or the like.

It is another object of the present invention to provide a surface acoustic wave device which is capable of exhibiting high temperature stability and being downsized.

In accordance with the present invention, a wafer constructed of a trigonal lanthanum/gallium silicate (so-called langasite) crystal cut out at a predetermined cut angle α. The wafer, supposing that the trigonal lanthanum/gallium silicate crystal has three crystal axes including an X-axis (electric axis), a Y-axis (mechanical axis) and a Z-axis (optical axis), is cut out so that a normal line (n) on a surface of the wafer has the cut angle α defined to be $20°\leq\alpha\leq 40°$ with respect to the Y-axis in a counterclockwise direction from the Y-axis in a Y-Z plane or $-1.5°\leq\alpha\leq 15°$ with respect to the Y-axis in a clockwise direction from the Y-axis in the Y-Z plane.

In accordance with the present invention, a surface acoustic wave device comprising a wafer constructed of a trigonal lanthanum/gallium silicate crystal cut out at predetermined cut angles (α, β) is provided. Application of a voltage signal of a predetermined level to the wafer permits a surface acoustic wave to be excited in the wafer and propagate in the wafer.

As the first configuration, the wafer, supposing that the trigonal lanthanum/gallium silicate crystal has three crystal axes including an X-axis (electric axis), a Y-axis (mechanical axis) and a Z-axis (optical axis), is cut out so that a normal line (n) on a surface of the wafer has the cut angle α defined to be $20°\leq\alpha\leq 40°$ with respect to the Y-axis in a counterclockwise direction from the Y-axis in a Y-Z plane and a propagation direction (S) of the surface acoustic wave has the cut angle β defined to be $35°\leq\beta\leq 70°$ with respect to the X-axis in a counterclockwise direction from the X-axis in the surface of the wafer.

As the second configuration, the wafer, supposing that the trigonal lanthanum/gallium silicate crystal has three crystal axes including an X-axis(electric axis), a Y-axis (mechanical axis) and a Z-axis(optical axis), is cut out so that a normal line (n) on a surface of the wafer has the cut angle α defined to be $-1.5°\leq\alpha\leq 15°$ with respect to the Y-axis in a clockwise direction from the Y-axis in a Y-Z plane and a propagation direction (S) of the surface acoustic wave has the cut angle β defined to be $70°\leq\beta\leq 120°$ with respect to the X-axis in a counterclockwise direction from the X-axis in the surface of the wafer.

In a preferred embodiment of the present invention, the wafer is provided thereon with a pair of excitation electrodes for excitation of the surface acoustic wave and a pair of output electrodes for converting the surface acoustic wave into an electric signal. The excitation electrodes and output electrodes are arranged in a manner to be juxtaposed to each other in the propagation direction (S) of the surface acoustic wave.

In a preferred embodiment of the present invention, the wafer is provided thereon with reflectors for reflecting the surface acoustic wave propagating in the wafer.

BRIEF DESCRIPTION OF THE DRAWINGS

These and other objects and many of the attendant advantages of the present invention will be readily appreciates as the same becomes better understood by reference to the following detailed description when considered in connection with the accompanying drawings; wherein.

DETAILED DESCRIPTION OF THE PREFERRED EMBODIMENTS

Now, the present invention will be described hereinafter with reference to the accompanying drawings.

Figure 1:
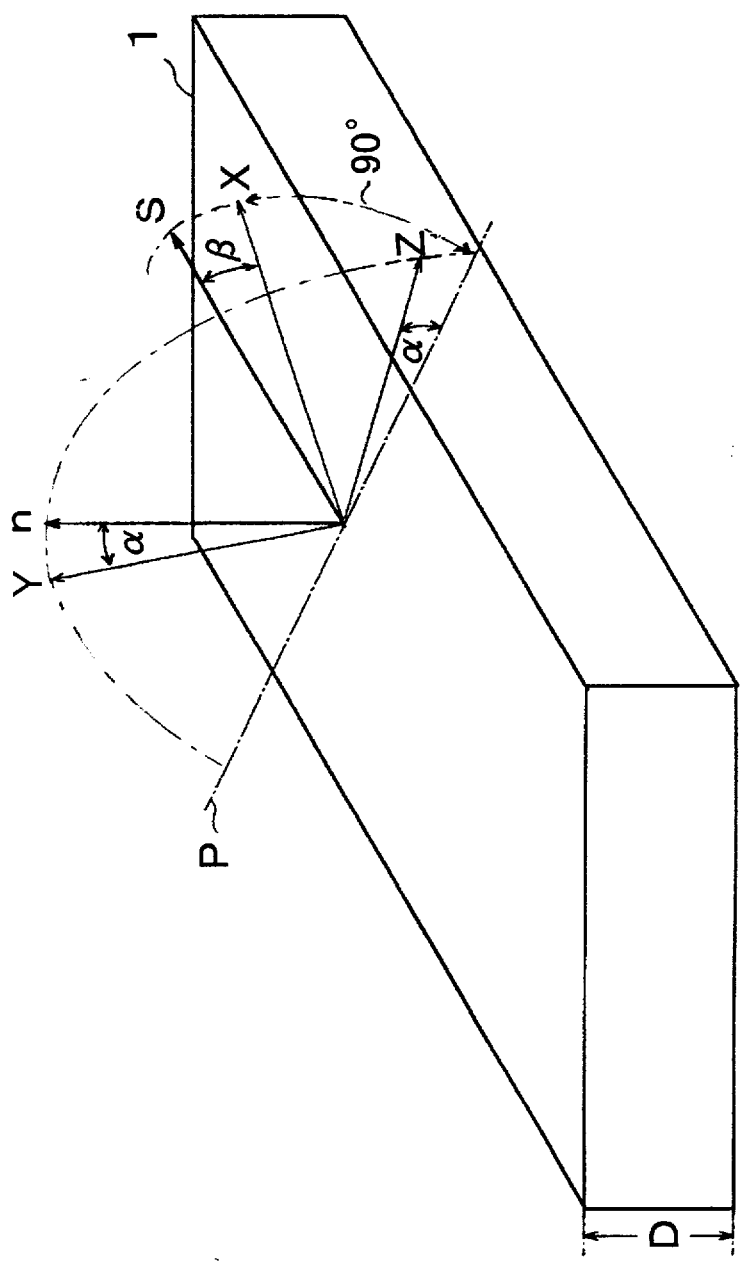
FIG. 1 is a perspective view showing an embodiment of a wafer according to the present invention.

Referring first to FIG. 1, an embodiment of a wafer according to the present invention is illustrated. A wafer of the illustrated embodiment designated at reference numeral 1 in FIG. 1 is constructed of a trigonal lanthanum/gallium silicate ($La_3Ga_5SiO_{14}$) crystal cut out at a predetermined cut angle $\alpha$. Supposing that the trigonal lanthanum/gallium silicate crystal has three crystal axes including an X-axis (electric axis), a Y-axis (mechanical axis) and a Z-axis (optical axis), the wafer 1 is cut out so that a normal line (n) on a surface of the wafer 1 has the cut angle $\alpha$ defined to be $20° \leq \alpha \leq 40°$ with respect to the Y-axis in a counterclockwise direction from the Y-axis in a Y-Z plane or $-1.5° \leq \alpha\alpha \leq 15°$ with respect to the Y-axis in a clockwise direction from the Y-axis in the Y-Z plane.

The wafer 1 obtained by cutting out the trigonal lanthanum/gallium silicate crystal at the cut angle $\alpha$ described above is further cut out at a predetermined cut angle $\beta$ when it is directed to provision of a surface acoustic wave device. More particularly, the wafer 1 is cut out so that a propagation direction (S) of a surface acoustic wave has the cut angle $\beta$ defined to be $35° \leq \beta \leq 70°$ with respect to the X-axis in a counterclockwise direction from the X-axis in the surface of the wafer 1 or the cut angle $\beta$ defined to be $70° \leq \beta \leq 120°$ with respect to the X-axis in a counterclockwise direction from the X-axis in the surface of the wafer 1. Such cutting-out of the wafer 1 permits the surface acoustic wave device to exhibit high temperature stability and be downsized.

In FIG. 1, reference character P designates a projection line of the Y-Z plane onto the surface of the wafer 1, wherein an S-X-P plane is defined in the surface of the wafer 1 and an angle between the X-axis and the projection line P in the S-X-P plane is defined to be 90°. Also, in FIG. 1, a Y-n-Z-P plane is defined in the Y-Z plane. In the embodiment of FIG. 1, as described above, the normal line (n) on the surface of the wafer 1 has the cut angle $\alpha$ defined in the clockwise direction from the Y-axis in the Y-Z plane.

Figure 2:
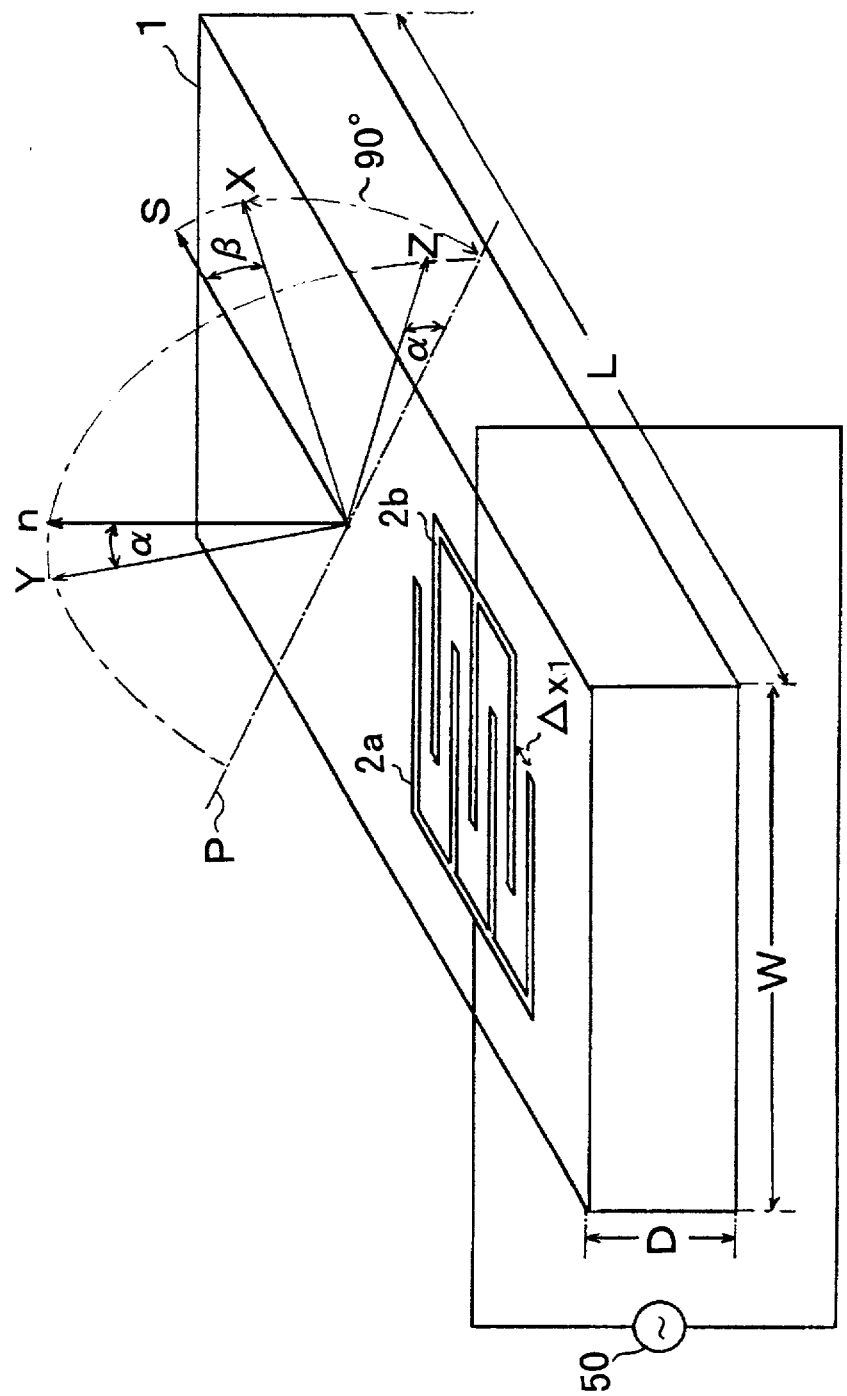
FIG. 2 is a perspective view showing an embodiment of a surface acoustic wave filter according to the present invention.

Referring now to FIG. 2, an embodiment of a surface acoustic wave device according to the present invention is illustrated. The surface acoustic wave device of FIG. 2 is in the form of a surface acoustic wave filter (piezoelectric device) including a wafer (piezoelectric plate) 1 prepared by cutting out a trigonal lanthanum/gallium silicate ($La_3Ga_5SiO_{14}$) crystal at predetermined cut angles ($\alpha$, $\beta$) and is so constructed that application of a voltage signal of a predetermined level to the wafer 1 permits a surface acoustic wave to be excited in the wafer 1 and then propagate in the wafer 1.

More particularly, the surface acoustic wave device shown in FIG. 2 includes the wafer 1 made of the trigonal lanthanum/gallium silicate crystal and a pair of excitation electrodes 2a and 2b for excitation of the surface acoustic wave arranged on a main or major surface of the wafer 1 in a manner to be spaced from each other at a predetermined interval $\Delta x1$ in a phase velocity direction (S) of the surface acoustic wave (hereinafter also referred to "propagation direction of surface acoustic wave"). Thus, application of a radiofrequency voltage to the excitation electrodes 2a and 2b in one pair from, for example, a power supply 50 permits the surface acoustic wave to be excited in the wafer 1 and then propagate in the wafer 1.

Figure 3:
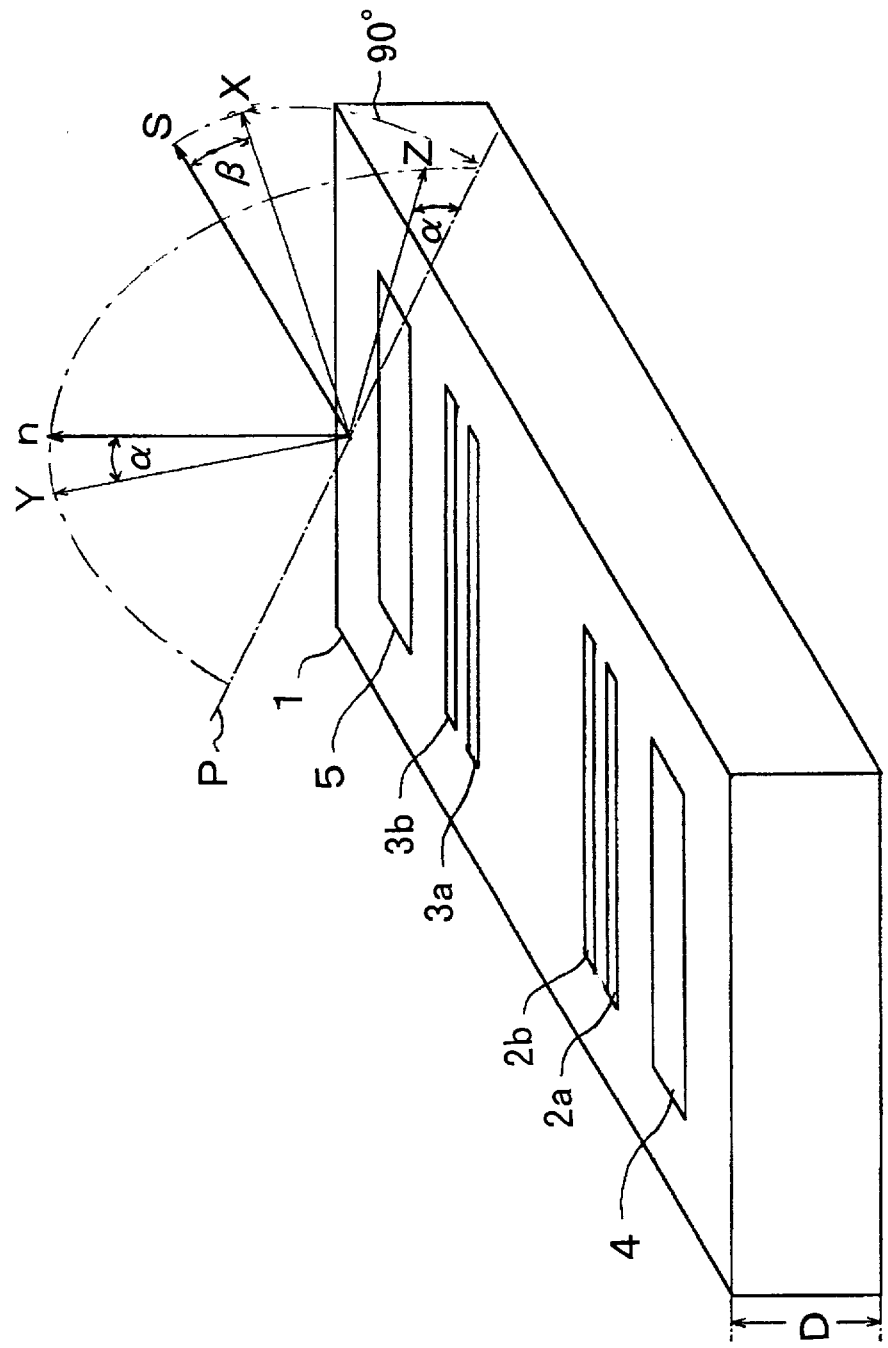
FIG. 3 is another aspect of the surface acoustic wave filter shown in FIG. 2.
Figure 4:
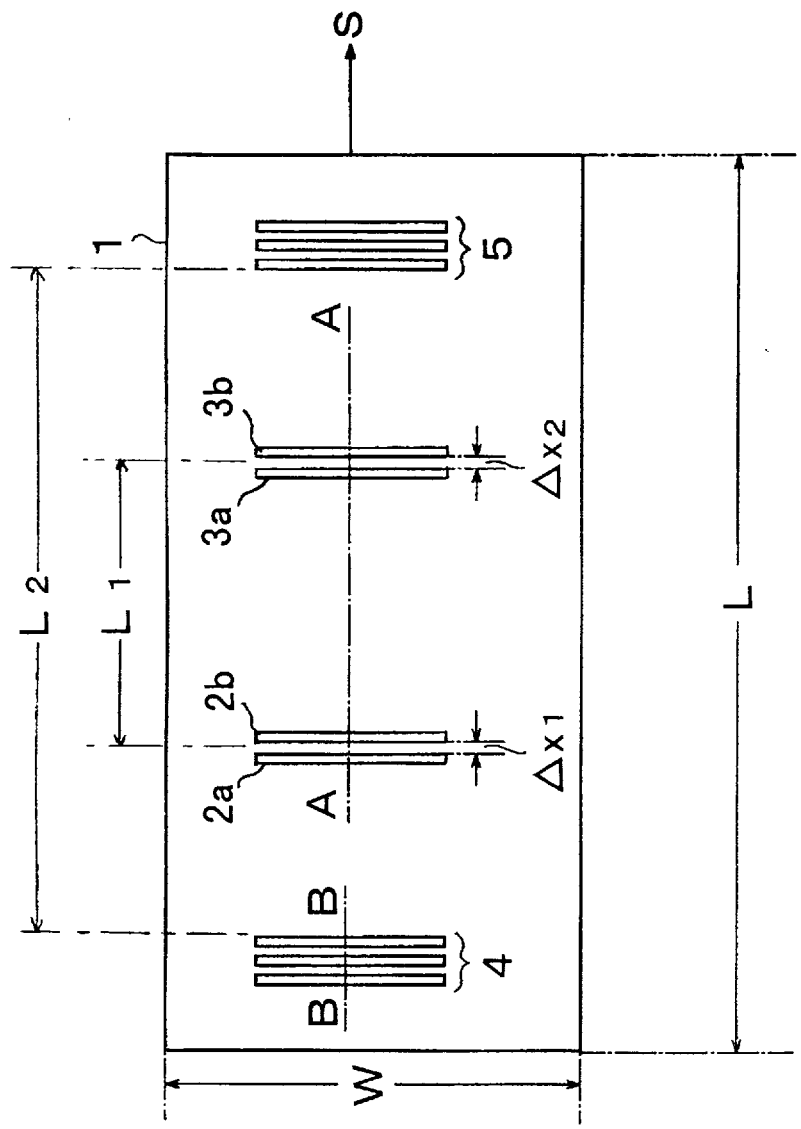
FIG. 4 is a plan view of the surface acoustic wave filter shown in FIG. 3.

Referring now to FIGS. 3 and 4, another aspect of the surface acoustic wave device of FIG. 2 is illustrated, wherein FIGS. 3 is a perspective view of the surface acoustic wave device and FIG. 4 is a plan view of the device. The surface acoustic wave device in FIGS. 3 and 4 is in the form of a surface acoustic wave filter (piezoelectric device) including a wafer (piezoelectric plate) 1 provided by cutting out a trigonal lanthanum/gallium silicate ($La_3Ga_5SiO_{14}$) crystal at predetermined cut angles ($\alpha$, $\beta$) and is so constructed that application of a voltage signal of a predetermined level to the wafer 1 permits a surface acoustic wave to be excited in the wafer 1 and then propagate in the wafer 1. Then, the surface acoustic wave propagating in the wafer 1 is converted into an electric signal, which is then output therefrom.

More specifically, the surface acoustic wave device in FIGS. 3 and 4 includes the wafer 1 made of the trigonal lanthanum/gallium silicate crystal and a pair of excitation electrodes 2a and 2b for excitation of the surface acoustic wave arranged on a main or major surface of the wafer 1 in a manner to be spaced from each other at a predetermined interval $\Delta x1$ in the propagation direction (S) of surface acoustic wave. Also, the wafer 1 is provided on the major surface thereof with a pair of output electrodes 3a and 3b in a manner to be spaced from each other at a predetermined interval $\Delta x2$ in the propagation direction (S) of the surface acoustic wave. The output electrodes 3a and 3b function to convert the surface acoustic wave propagating in the wafer 1 into an electric signal and then output it therefrom. The excitation electrodes 2a and 2b in one pair and the output electrodes 3a and 3b in one pair are juxtaposed to each other in the propagation direction (S) of the surface acoustic wave. As will be noted from the above, the direction (S) may be defined to be a main-axis direction of the excitation electrodes 2a and 2b in a pair. Alternatively, it may be defined to be a direction of a line defined by connecting a center of the excitation electrodes 2a, 2b and that of the output electrodes 3a, 3b to each other.

Also, the surface acoustic wave device in FIGS. 3 and 4 may be so constructed that the wafer 1 is formed thereon with a pair of reflectors 4 and 5 for reflecting the surface acoustic wave propagating in the wafer. Such arrangement of the reflectors 4 and 5 permits the surface acoustic wave device to function as an oscillator for oscillating or resonating the excited surface acoustic wave between the reflectors 4 and 5.

An object of the present invention, as described above, is to provide a surface acoustic wave device which is capable of exhibiting high temperature stability and being downsized. For this purpose, the inventors made a careful study. As a results, it was found that such an object of the present invention is effectively accomplished when, as the first configuration, supposing that the trigonal lanthanum/gallium silicate crystal has the three crystal axes including the X-axis (electric axis), Y-axis (mechanical axis) and Z-axis (optical axis), the wafer 1 of FIG. 2 or FIGS. 3 and 4 is cut out so that the normal line (n) on the surface of the wafer 1 has the cut angle $\alpha$ defined to be $20° \leq \alpha \leq 40°$ with respect to the Y-axis in the counterclockwise direction from the Y-axis in the Y-Z plane and the propagation direction (S) of the surface acoustic wave has the cut angle $\beta$ defined to be $35° \leq \beta \leq 70°$ with respect to the X-axis in the counterclockwise direction from the X-axis in the surface of the wafer 1.

Also, it was found that the object is likewise accomplished when, as the second configuration, supposing that the trigonal lanthanum/gallium silicate crystal has the three crystal axes including the X-axis (electric axis), Y-axis (mechanical axis) and Z-axis (optical axis), the wafer 1 of FIG. 2 or FIGS. 3 and 4 is cut out so that the normal line(n) on the surface of the wafer 1 has the cut angle α defined to be $-1.5° \leq \alpha \leq 15°$ with respect to the Y-axis in the clockwise direction from the Y-axis in the Y-Z plane and the propagation direction (S) of the surface acoustic wave has the cut angle β defined to be $70° \leq \beta \leq 120°$ with respect to the X-axis in the counterclockwise direction from the X-axis in the surface of the wafer 1.

Such cutting-out of the wafer 1 at the cut angles (α, β) of the first or second configuration permits the surface acoustic wave device to exhibit high temperature stability and be downsized.

Now, a structure of the surface acoustic wave device of FIG. 2 or FIGS. 3 and 4 and a size thereof will be described hereinafter.

In the surface acoustic wave device of FIG. 2 or FIGS. 3 and 4, the wafer 1 may be constructed into dimensions as small as about 4.4 mm in length L, about 1.9 mm in width W and about 0.4 mm in thickness D.

Figure 5:
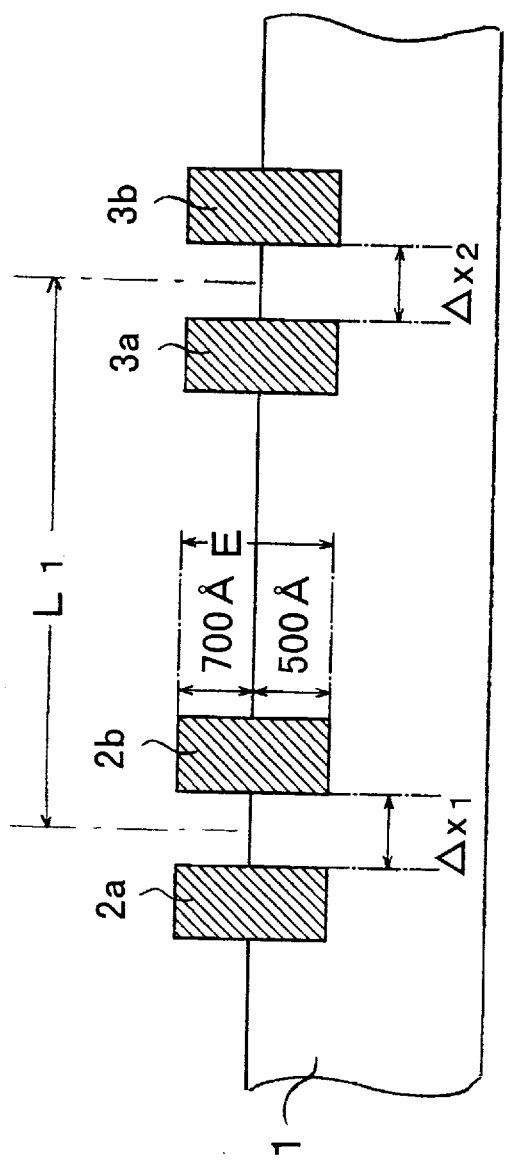
FIG. 5 is a sectional view taken along line A—A of FIG. 4.

Also, the excitation electrodes 2a and 2b in one pair and the output electrodes 3a and 3b in one pair, as shown in FIG. 5 which is a sectional view taken along line A—A of FIG. 4, each are made of a conductive material having a thickness E of about 1200 Å and embedded in the wafer 1 by a depth of about 500 Å from the surface thereof. Thus, the electrodes each are arranged so as to project or extend by about 700 Å from the surface of the wafer 1. The interval Δx1 between the excitation electrodes 2a and 2b and the interval Δx2 between the output electrodes 3a and 3b each may be set to be about 1.5 μm. Also, an interval L1 between a center of the excitation electrodes 2a, 2b and that of the output electrodes 3a, 3b may be set to be about 3 mm.

Figure 6:
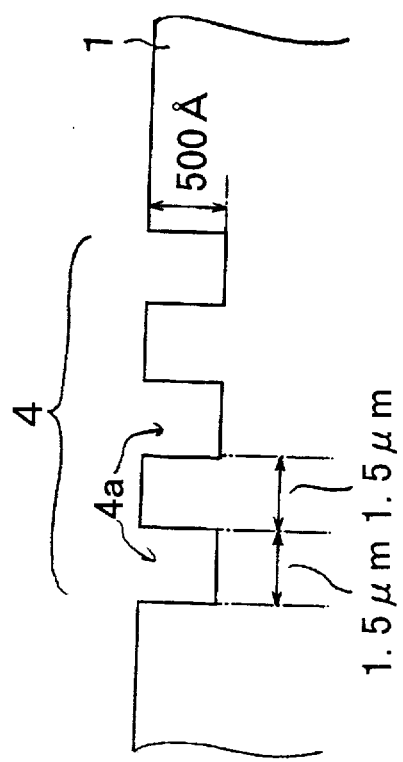
FIG. 6 is a sectional view taken along line B—B of FIG. 4.

Further, one of the reflectors or the reflector 4, as shown in FIG. 6 which is a sectional view taken along line B—B of FIG. 4, is cyclically formed thereon with a grooves 4a of, for example, 500 Å in depth and 1.5 μm in width in a manner to be spaced from each other at pitches of 3.0 μm. The other reflector 5 likewise may be cyclically formed thereon with grooves (not shown) of, for example, 500 Å in depth and 1.5 μm in width in a manner to be spaced from each other at pitches of 3.0 μm. One reflector 4 and the other reflector 5 thus constructed function as a reflecting system (a pair of two grooved reflectors) for the surface acoustic wave propagating in the wafer 1. The reflectors 4 and 5 are arranged so as to be spaced from each other at an interval L2 of, for example, about 5 mm.

Now, the manner of operation of the surface acoustic wave device having the first or second configuration in FIG. 2 or FIGS. 3 and 4 will be described hereinafter.

When a high frequency voltage of about 600 MHz in frequency and about 0.1V in voltage amplitude is applied in the form of an input signal between the excitation electrodes 2a and 2b from the power supply 50, the excitation electrodes 2a and 2b permit a surface acoustic wave to be excited in the wafer 1 made of the trigonal lanthanum/gallium silicate crystal. The thus-excited surface acoustic wave propagates at a propagation velocity of about 2.5 to 2.9 km/sec in the wafer 1. At this time, the propagation velocity of the surface acoustic wave or a characteristic frequency of the device is reduced in temperature dependency. For example, a variation in frequency of the surface acoustic wave at a temperature within a range between −24° C. and +44° C. is limited to about $1 \times 10^{-6}$ MHz/°C. The device of FIGS. 3 and 4 permits the surface acoustic wave propagating in the wafer 1 to be output in the form of an electric signal from the output electrodes 3a and 3b. More particularly, when the surface acoustic wave reaches the output electrodes 3a and 3b, a voltage is induced between the output electrodes 3a and 3b and then may be output in the form of an output signal. The output signal between the output electrodes 3a and 3b has a frequency of about 400 to 600 MHz and a voltage amplitude of about 0.07V.

Thus, the surface acoustic wave device which is constructed of the wafer 1 cut out at the cut angles (α, β) of the first or second configuration permits the propagation velocity of the surface acoustic wave propagating in the wafer 1 to be reduced to a level of about 2.5 to 2.9 km/sec as compared with the prior art, resulting in being reduced in size.

Also, the surface acoustic wave device of each of the first or second configuration permits the propagation velocity of the surface acoustic wave or the characteristic frequency of the device to be reduced in temperature dependency. For example, a variation in frequency of the surface acoustic wave at a temperature within a range between −24° C. and +44° C. is limited to a level as low as about $1 \times 10^{-6}$ MHz/°C. Thus, the surface acoustic wave device exhibits high temperature stability as compared with the prior art.

In the surface acoustic wave device of the present invention, the excitation electrodes 2a, 2b and output electrodes 3a, 3b may be formed into any desired configuration and size. Also, the reflectors 4 and 5 may be formed into any desired configuration and size. Further, in the embodiment, the reflectors 4 and 5 each are provided in the form of a groove on the wafer 1. Alternatively, they may be formed by any other suitable techniques such as vapor deposition or the like.

The invention will be understood more readily with reference to the following example; however, the example is intended to illustrate the invention and is not to be construed to limit the scope of the invention.

(EXAMPLE)

Figure 7:
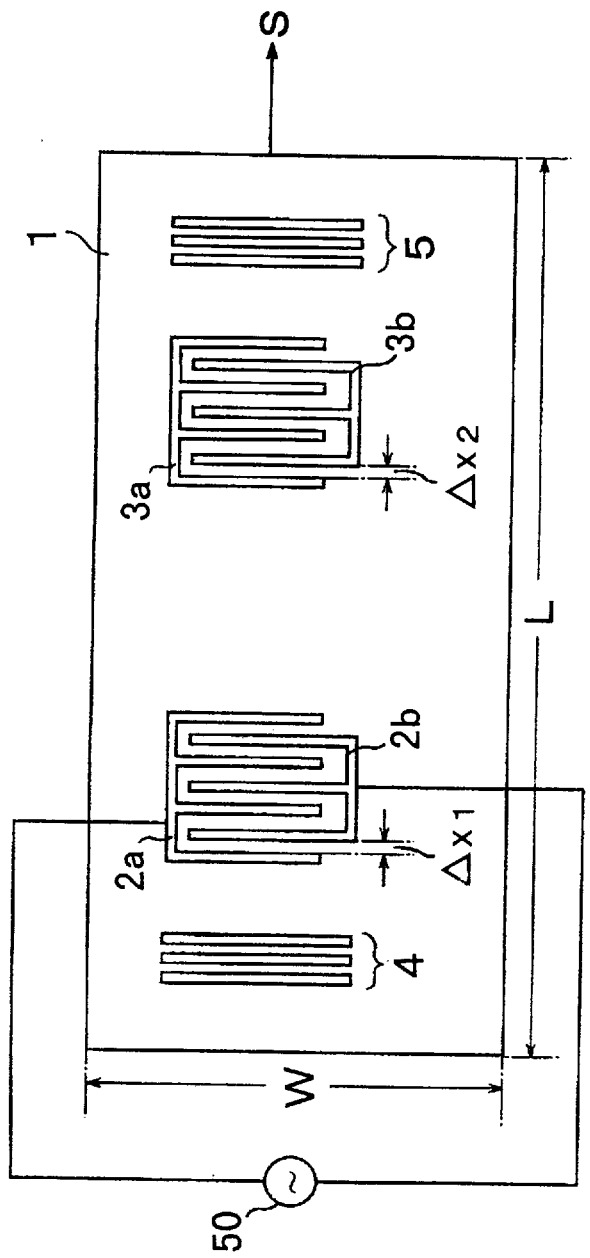
FIG. 7 is a plan view showing an example of a surface acoustic wave device according to the present invention.

The inventors prepared such a surface acoustic wave device (oscillator) as shown in FIG. 7 which is an example of the present invention and examined characteristics thereof. A wafer 1 was constructed of a trigonal lanthanum/gallium silicate ($La_3Ga_5SiO_{14}$) crystal cut out at predetermined cut angles (α, β) of the first or second configuration. Then, the wafer 1 thus cut out was subject to surface polishing and then subject to vapor deposition by photolithography, resulting in an inter digital transducer system including two sets of electrode pairs (2a, 2b; 3a, 3b) being provided thereon. Further, a channel-reflector system including two sets of reflectors 4 and 5 was formed on the wafer 1.

The wafer 1 was formed into a size as small as about 4.4 mm in length L, about 1.9 mm in width W and about 0.4 mm in thickness D. Also, an interval Δx1 between the excitation electrodes 2a and 2b in one pair and an interval Δx2 between the output electrodes 3a and 3b in one pair each were set to be about 1.5 μm. Then, a high frequency voltage of, for example, about 400 to 600 MHz in frequency and about 0.1V in voltage amplitude was applied as an input signal between the excitation electrodes 2a and 2b, resulting in a surface acoustic wave being excited in the wafer 1 of trigonal lanthanum/gallium silicate by the excitation electrodes 2a and 2b.

Figure 8:
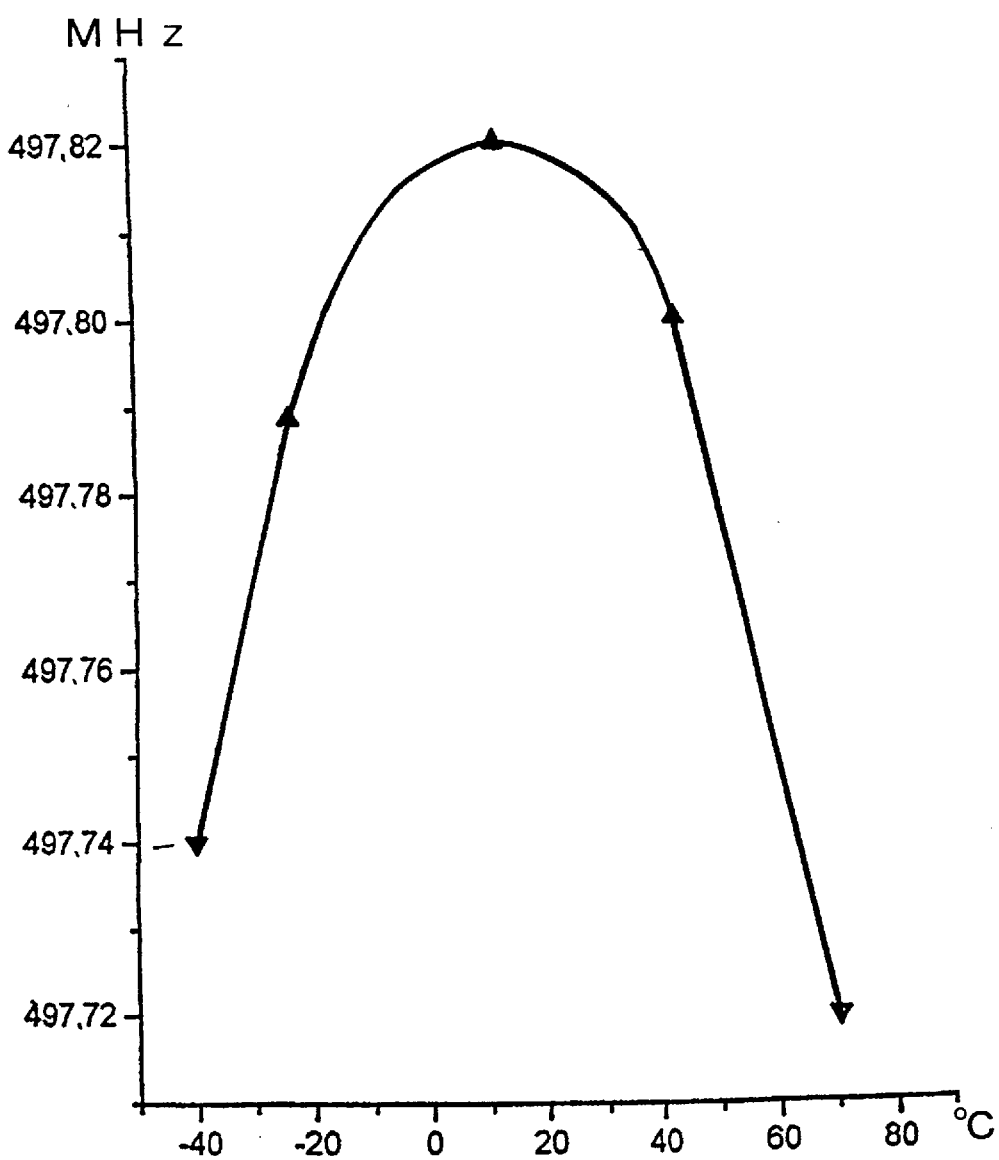
FIG. 8 is a graphical representation showing an example of temperature characteristics of a central frequency of the surface acoustic wave device shown in FIG. 7, which was obtained by an experiment.

FIG. 8 shows an example of temperature characteristics obtained by an experiment of a central frequency of the surface acoustic wave device thus prepared. As shown in FIG. 8, the surface acoustic wave device permitted the surface acoustic wave excited to propagate at a propagation velocity of about 2.5 to 2.9 km/sec while keeping the propagation velocity of the surface acoustic wave or the characteristic frequency of the device reduced in temperature dependency and limiting a variation in oscillating frequency to about $1 \times 10^{-8}$ MHz/°C. at a temperature within a range between −24° C. and +44° C. Such characteristics of the device were significantly improved as compared with those of the conventional prototype surface acoustic wave device.

Also, two samples (SP1 and SP2) of a surface acoustic wave device including a wafer cut out at cut angles ($\alpha$, $\beta$) of the first configuration. Likewise, two samples (SP3 and SP4) of a surface acoustic wave device including a wafer cut out at cut angles ($\alpha$, $\beta$) of the second configuration. Four such samples SP1, SP2, SP3 and SP4 thus prepared each were then subject to examination of an oscillating frequency (central frequency) thereof at various temperatures. Results of the test were as shown in Table 1.

TABLE 1

| | Oscillating Frequency (Central Frequency) (MHz) | | | | |
|---|---|---|---|---|---|
| Sample | −39° C. | −24° C. | +18° C. | +44° C. | +72° C. |
| SP1 | 537.48 | 537.49 | 537.49 | 537.42 | 537.30 |
| SP2 | 536.02 | 536.01 | 536.02 | 535.97 | 535.84 |
| SP3 | 497.74 | 497.79 | 497.82 | 497.80 | 497.72 |
| SP4 | 497.87 | 497.90 | 497.95 | 497.92 | 497.85 |

As will be noted from Table 1, the samples SP1, SP2, SP3 and SP4 exhibited highly increased temperature stability as compared with the conventional prototype surface acoustic wave device. Also, the samples each decreased a propagation velocity of a surface acoustic wave, to thereby contribute to downsizing of the device.

Further, a sample of a surface acoustic wave device including a wafer cut out at cut angles other than those of the first and second configurations was prepared and likewise subject to examination of an oscillating frequency (central frequency) thereof at various temperatures. As a result, the sample was found to be highly deteriorated in temperature stability to a level up to 30 ppm/°C.

Thus, it was confirmed that in order to provide a surface acoustic wave device which is improved in temperature stability, reduces a propagation velocity of a surface acoustic wave and is downsized as compared with the conventional prototype surface acoustic wave device, a wafer of a trigonal lanthanum/gallium silicate ($La_3Ga_5SiO_{14}$) crystal is desirably cut out at the cut angles of the first or second configuration.

As can be seen from the foregoing, the wafer of the present invention provides a surface acoustic wave device which is increased in temperature stability and downsized.

Also, the surface acoustic wave device of the present invention exhibits high temperature stability and is significantly downsized.

While preferred embodiments of the invention have been described with a certain degree of particularity with reference to the drawings, obvious modifications and variations are possible in light of the above teachings. It is therefore to be understood that within the scope of the appended claims, the invention may be practiced otherwise than as specifically described.

What is claimed is:

1. A wafer constructed of a trigonal lanthanum/gallium silicate crystal cut out at a predetermined cut angle $\alpha$, wherein said wafer, supposing that the trigonal lanthanum/gallium silicate crystal has three crystal axes including an X-axis (electric axis), a Y-axis (mechanical axis) and a Z-axis (optical axis), is cut out so that a normal line (n) on a surface of said wafer has the cut angle $\alpha$ defined to be $20° \leq \alpha \leq 40°$ with respect to the Y-axis in a counterclockwise direction from the Y-axis in a Y-Z plane or $-1.5° \leq \alpha \leq 15°$ with respect to the Y-axis in a clockwise direction from the Y-axis in the Y-Z plane.

2. A surface acoustic wave device comprising a wafer constructed of a trigonal lanthanum/gallium silicate crystal cut out at predetermined cut angles ($\alpha$, $\beta$), wherein:

application of a voltage signal of a predetermined level to said wafer permits a surface acoustic wave to be excited in said wafer and propagate in said wafer; and said wafer, supposing that the trigonal lanthanum/gallium silicate crystal has three crystal axes including an X-axis (electric axis), a Y-axis (mechanical axis) and a Z-axis (optical axis), is cut out so that a normal line (n) on a surface of said wafer has the cut angle $\alpha$ defined to be $20° \leq \alpha \leq 40°$ with respect to the Y-axis in a counterclockwise direction from the Y-axis in a Y-Z plane and a propagation direction (S) of said surface acoustic wave has the cut angle $\alpha$ defined to be $35° \leq \beta \leq 70°$ with respect to the X-axis in a counterclockwise direction from the X-axis in the surface of said wafer.

3. A surface acoustic wave device as defined in claim 2, wherein said wafer is provided thereon with a pair of excitation electrodes for excitation of the surface acoustic wave and a pair of output electrodes for converting the surface acoustic wave into an electric signal;

said excitation electrodes and output electrodes being arranged in a manner to be juxtaposed to each other in the propagation direction (S) of said surface acoustic wave.

4. A surface acoustic wave device as defined in claim 3, wherein said wafer is provided thereon with reflectors for reflecting the surface acoustic wave propagating in said wafer.

5. A surface acoustic wave device comprising a wafer constructed of a trigonal lanthanum/gallium silicate crystal cut out at predetermined cut angles ($\alpha$, $\beta$), wherein:

application of a voltage signal of a predetermined level to said wafer permits a surface acoustic wave to be excited in said wafer and propagate in said wafer; and said wafer, supposing that the trigonal lanthanum/gallium silicate crystal has three crystal axes including an X-axis, (electric axis), a Y-axis (mechanical axis) and a Z-axis (optical axis), is cut out so that a normal line (n) on a surface of said wafer has the cut angle $\alpha$ defined to be $-1.5° \leq \alpha \leq 15°$ with respect to the Y-axis in a clockwise direction from the Y-axis in a Y-Z, plane and a propagation direction (S) of said surface acoustic wave has the cut angle $\beta$ defined to be $70° \leq \beta \leq 120°$ with respect to the X-axis in a counterclockwise direction from the X-axis in the surface of said wafer.

6. A surface acoustic wave device as defined in claim 5, wherein said wafer is provided thereon with a pair of excitation electrodes for excitation of the surface acoustic wave and a pair of output electrodes for converting the surface acoustic wave into an electric signal;

said excitation electrodes and output electrodes being arranged in a manner to be juxtaposed to each other in the propagation direction (S) of said surface acoustic wave.

7. A surface acoustic wave device as defined in claim 6, wherein said wafer is provided thereon with reflectors for reflecting the surface acoustic wave propagating in said wafer.

* * * * *